United States Patent [19]

Seyyedy

[11] Patent Number: 5,724,301
[45] Date of Patent: *Mar. 3, 1998

[54] HIERARCHICAL MEMORY ARRAY STRUCTURE HAVING ELECTRICALLY ISOLATED BIT LINES FOR TEMPORARY DATA STORAGE

[75] Inventor: Mir Majid Seyyedy, Boise, Id.

[73] Assignee: Micron Technology, Inc., Boise, Id.

[*] Notice: The term of this patent shall not extend beyond the expiration date of Pat. No. 5,600,602.

[21] Appl. No.: 752,578

[22] Filed: Nov. 21, 1996

Related U.S. Application Data

[63] Continuation of Ser. No. 417,213, Apr. 5, 1995, Pat. No. 5,600,602.

[51] Int. Cl.$^6$ ............................................. G11C 7/00
[52] U.S. Cl. ................... 365/230.03; 365/203; 365/205
[58] Field of Search ........................... 365/230.03, 205, 365/202, 203, 63, 51, 207, 208

[56] References Cited

U.S. PATENT DOCUMENTS

| | | | |
|---|---|---|---|
| 4,056,811 | 11/1977 | Baker | 365/189 |
| 4,636,988 | 1/1987 | Tran | 365/208 |
| 4,807,191 | 2/1989 | Flannagan | 365/189 |
| 4,819,207 | 4/1989 | Sakui et al. | 365/222 |
| 4,888,732 | 12/1989 | Inoue et al. | 365/51 |
| 4,926,382 | 5/1990 | Sakui et al. | 365/203 |
| 4,970,685 | 11/1990 | Koyanagi | 365/51 |
| 4,980,863 | 12/1990 | Ogihara | 365/205 |
| 5,088,062 | 2/1992 | Shikata | 365/189.05 |
| 5,274,598 | 12/1993 | Fujii et al. | 365/205 |
| 5,295,101 | 3/1994 | Stephans, Jr. et al. | 365/200 |
| 5,307,471 | 4/1994 | Ishikawa | 365/49 |
| 5,353,255 | 10/1994 | Komuro | 365/203 |
| 5,361,233 | 11/1994 | Kotani | 365/207 |
| 5,367,488 | 11/1994 | An | 365/202 |
| 5,384,745 | 1/1995 | Konishi et al. | 365/230 |
| 5,386,394 | 1/1995 | Kawahara et al. | 365/230.03 |
| 5,495,440 | 2/1996 | Asakura | 365/149 |
| 5,570,319 | 10/1996 | Santoro et al. | 365/230.03 |
| 5,600,602 | 2/1997 | Seyyedy | 365/230.03 |

FOREIGN PATENT DOCUMENTS

| | | |
|---|---|---|
| 0101884 | 3/1984 | European Pat. Off. |
| 0258715 | 3/1988 | European Pat. Off. |
| 0593152 | 4/1994 | European Pat. Off. |

OTHER PUBLICATIONS

Horiguchi, M., et al., "A Flexible Redundancy Technique for High-Density DRAMs", *IEEE Journal of Solid-State Circuits*, 26, No. 1, (Jan., 1991).

Sugibayashi, T., et al., *A 1Gb DRAM for File Applications*, 1995 IEEE International Solid-State Circuits Conference, Feb. 17, 1995.

*Primary Examiner*—Tan T. Nguyen
*Attorney, Agent, or Firm*—Schwegman, Lundberg, Woessner & Kluth, P.A.

[57] ABSTRACT

An integrated memory array circuit, such as a DRAM, has a global bit line communicating a global bit line signal with a first electrode of each of a plurality of FET devices. The primary global bit line has a plurality of subarray bit lines. Each subarray bit line communicates a subarray bit line signal with a second electrode of one of the FET devices and with a first electrode of each of a plurality of subarray FET devices. Each subarray FET device has a gate communicating a word line signal with a word line. Each subarray FET device has a second electrode communicating a one bit storage signal with a capacitor. Each subarray FET is activated by a word line signal from a corresponding word line to electrically isolate a corresponding capacitor from its corresponding subarray bit line, or to electrically connect the corresponding capacitor with its corresponding subarray bit line. A device senses and amplifies the global bit line signal and outputs an amplified global bit line signal to a column decode device. By using switches and FETs to electrically isolated memory array structure components, data can be temporarily stored on such components, including the device that amplifies the global bit line signal, the global bit line, each of the subarray bit lines, and each of the capacitors.

14 Claims, 7 Drawing Sheets

HIERARCHICAL MEMORY ARRAY STRUCTURE HAVING ELECTRICALLY ISOLATED BIT LINES FOR TEMPORARY DATA STORAGE

This is a continuation of application Ser. No. 08/417,213, filed Apr. 5, 1995 now U.S. Pat. No. 5,600,602.

BACKGROUND OF THE INVENTION

1. The Field of the Invention

This invention generally relates to semiconductor integrated circuit memory structures and, more precisely, relates to a memory array having global array bit lines each of which is connected hierarchically above a plurality of electrically isolatable subarray bit lines, each subarray bit line being connected hierarchically above a plurality of memory cells, each memory cell being in communication with a corresponding word line, where data can be left floating and can be refreshed in temporary storage on both the global array bit lines and the electrically isolatable subarray bit lines which have sufficient capacitance to maintain readily accessible data in temporary storage.

2. The Relevant Technology

In dynamic random access memory chips, bit line capacitance is an important consideration. A reduction in bit line capacitance reduces the amount of power required by the memory cell structure. Attempts have been made to optimize or maintain the overall cell capacitance to bit line capacitance ratio. In the past, efforts to maintain the cell capacitance to bit line capacitance ratio have been made by segmenting the bit line array and by adding more N-sensamps, P-sensamps, and/or more column decodes. While such additional structure makes progress toward maintenance of the cell capacitance to bit line capacitance ratio, these gains are made at a cost of adding expensive overhead to the memory chip, as well as reducing the efficiency of the memory chip.

In addition to the forgoing problems in the prior art, a need exists to improve the temporary data storage capability of high density memory array structures so as to increase the efficiency of data storage without increasing circuitry overhead for such temporary data storage.

SUMMARY AND OBJECTS OF THE INVENTION

An object of the invention is to reduce overall power consumption of a memory structure. By reducing the overall bit line capacitance of the memory structure, less power is consumed by the memory structure for a given cell capacitance. The strength of the signal from a bit line is proportional to its capacitance. Where a bit line capacitance is smaller, the signal is stronger. The benefit of a stronger signal is a better signal-to-noise ratio. In a favorable signal-to-noise ratio there is a margin to be operational in extremes of temperature and voltage to ensure a high operational standard of the memory structure.

Another object of the invention is, for a given bit line capacitance, reducing the die size of the memory structure as compared to conventional memory structures. Reducing the die size of the memory structure furthers the objective of miniaturizing the memory structure.

A still further object of the invention is to achieve the forgoing objects while improving the temporary data storage capability of high density memory array structures so as to increase the efficiency of data storage without increasing circuitry overhead for such temporary data storage that can be rapidly accessed.

In the inventive memory structure, a plurality of memory cells are connected hierarchically below a subarray bit line. At least one subarray bit line is connected hierarchically underneath a global bit line. Each global bit line is connected to both sensamp and column decode circuitry.

Preferably, the inventive design electrically isolates subarray bit lines one from another and from the global bit line. Once a selected subarray bit line is connected to the global bit line, the global bit line is connected to only the nonisolated subarray bit line. This, in turn, reduces the overall capacitance of the bit line because only the capacitance of nonisolated subarray bit lines is added to the overall capacitance of the corresponding global array bit line that is hierarchically thereabove. Further efficiencies are achieved by the sharing of sensamp and column decode devices with multiple global bit lines and subarray bit lines. In one preferred embodiment, a single column decode and dual sensamp devices are shared by two global bit lines, there being a total of 4,096 global bit lines to make up a 4 megabit memory chip.

The inventive memory structure increases memory array efficiency in high density memories by reducing die size for a given cell capacitance to bit line capacitance ratio as compared to conventional memory structures for like bit line capacitance, or alternatively, by reducing power consumption for a higher cell to bit line capacitance ratio. The inventive memory structure can be used on a great variety of memory types, including DRAM, SRAM, flash memory, EPROM, electrical memory structures, and other types of memories.

To optimize the cell capacitance to bit line capacitance ratio, an optimum combination of subarray bit lines can be layered hierarchically underneath global bit lines. By so optimizing, overhead is reduced due to shared use of sensamps and column decode devices by the global bit lines to produce a smaller die size requirement.

The inventive memory structure scheme of subarray bit lines and global bit lines also allows for shared column decode devices to reduce die size. Gains related to reduced die size requirements are achieved, as compared to like bit line capacitance in conventional memory structures by the sharing of sensamp and column decode devices.

The inventive memory structure also provides for refreshable data to be left floating in temporary storage on in the sensamp devices, the global array bit lines, the electrically isolatable subarray bit lines, and the memory cells which have sufficient capacitance to maintain data in temporary storage. The temporarily stored data can be rapidly accessed.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 8 shows a schematic diagram of another preferred embodiment of the inventive memory array structures as a 16 megabit memory chip having 2,048 superglobal bit lines on opposite sides of dual sensamp and column decode circuitry.

DETAILED DESCRIPTION OF THE PREFERRED EMBODIMENTS

Figure 1:
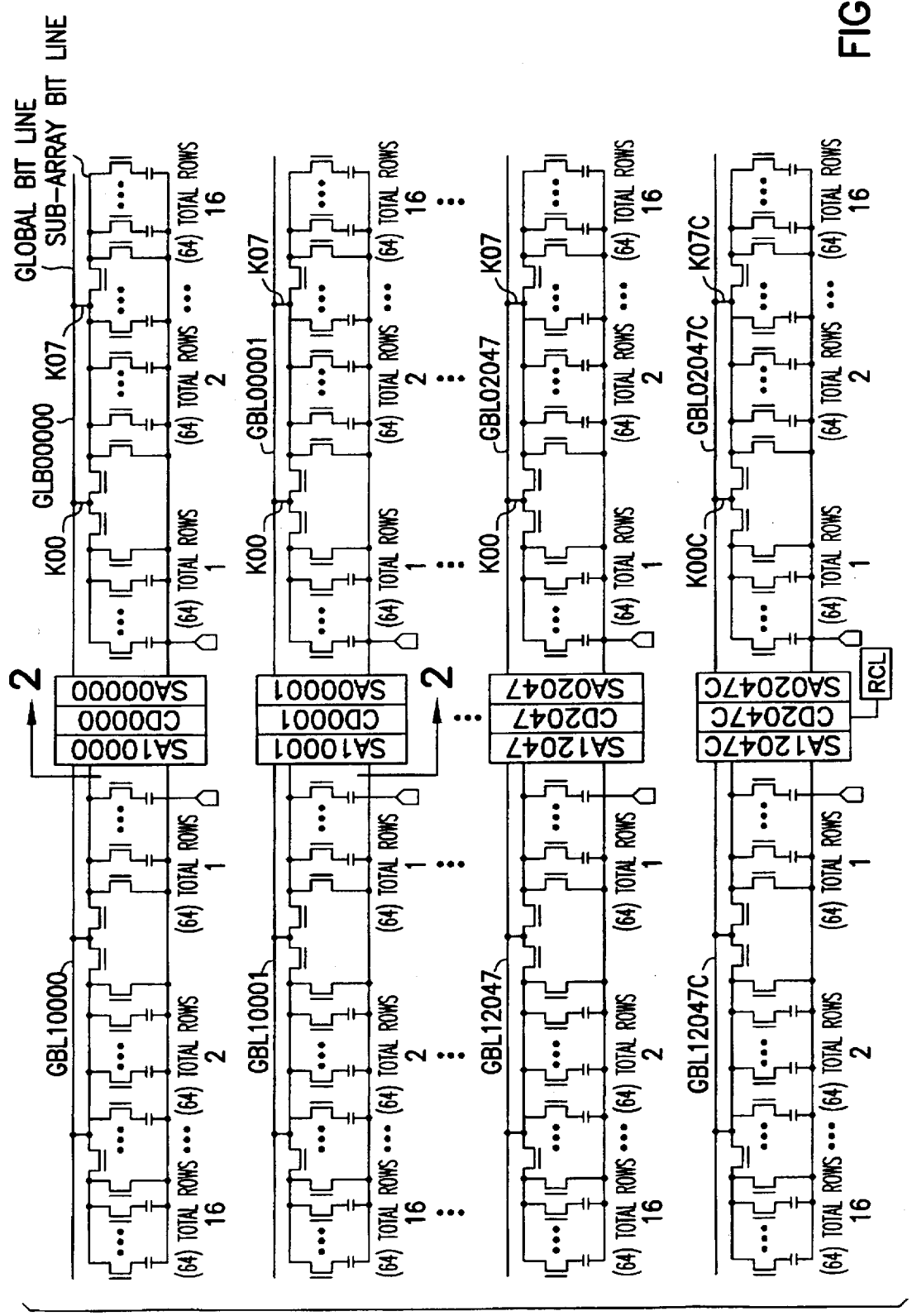
FIG. 1 shows a schematic diagram of a preferred embodiment of the inventive memory structure as a 4 megabit memory chip having 2,048 columns, each having global bit lines on opposite sides of dual sensamp and column decode circuitry.

FIG. 1 shows a schematic diagram of a preferred embodiment of the inventive memory structure. While two global bit lines share a column decode device on each of 2,048 columns, there is a separate sensamp device for each global bit line. The purpose of the sensamp device connected to the global bit lines is to amplify signals on subarray bit lines connected to the global bit lines. The schematic on the left, or secondary, side of the dual sensamp and column decode circuitry is a mirror image of that on the right, or primary, side. The top global bit lines on the first column are, from left to right, GBL1000 and GBL0000. The last global bit lines are, from left to right, GBL 12047 and GBL 02047. This referencing convention shows that there are a total of 4,096 global bit lines in the memory structure shown in FIG. 1.

In the preferred embodiment shown in FIG. 1, each global bit line has eight contacts to its corresponding subarray bit lines which are situated hierarchically under the global bit line. The contacts between each global bit line and its corresponding subarray bit lines are labeled from K00 through K07. Each contact to the global bit line connects two subarray bit lines. FIG. 1 shows a plurality of FETs, each of which has a gate and first and second electrodes, which electrodes function as source or drain regions. Each subarray bit line connects to 64 subarray FETs at a first electrode of each of the 64 subarray FETs. A second electrode of each of the 64 subarray FETs connects to a one-bit capacitor. The gate of each subarray FET in turn is connected to a word line. Through the subarray FET, each subarray bit line is connected hierarchically above 64 word lines. Thus, each global bit line is hierarchically above 16 subarray bit lines and each subarray bit line is hierarchically above 64 word lines, such that the schematic of FIG. 1 shows four megabits or 4,194,304 bits of memory. These four megabits are made up by 2,048 columns, each column having two global bit lines, each global bit line having 16 electrically violatable subarray bit lines having subarray FETs connected to 64 word lines.

With respect to FIG. 1, for both the primary and the secondary sides, each sensamp device the ability to store the signal of the global bit line when electrically isolated from the corresponding global bit line. Each sensamp device represents, by way of example and illustration, a means for sensing and amplifying the signal on the corresponding global bit line, and for outputting an amplified global bit line signal to a corresponding column decode device. The means for sensing and amplifying the global bit line signal is electrically isolated by a means for electrical switching situated in the means for sensing and amplifying the global bit line signal. Here, the column decode device represents, by way of example and illustration, a means for decoding the amplified global bit line signal.

Each global bit line has a capacitance to store the global bit line signal when electrically isolated from the corresponding sensamp device, and from its corresponding subarray bit lines. Like the electrical isolation of the global bit line, each subarray bit line has a capacitance to store a subarray bit line signal when electrically isolated from its corresponding global bit line, and from the corresponding plurality of memory cells or capacitors associated therewith. Lastly, each memory cell or capacitor has a capacitance to store a storage signal when electrically isolated from its corresponding subarray bit line.

In order to effect the forgoing electrical isolation scheme, the inventive integrated memory array circuit in FIG. 1 isolates the sensamp device by incorporating therein a means for electrical switching, which is represented and illustrated by the sensamp devices seen in FIG. 1. The global bit line is electrically isolated by both the electrical switching lo means and by the FETs or access devices corresponding to the global bit line. Each subarray bit line is electrically isolated by a corresponding one of the access devices hierarchically thereover, and by its corresponding subarray access devices hierarchically thereunder. Finally, each memory cell or capacitor is electrically isolated by a corresponding subarray access device or FET. When the foregoing memory array structure components of FIG. 1 have been electrically isolated, the data temporarily stored therein can be readily and rapidly accessed.

Figure 2:
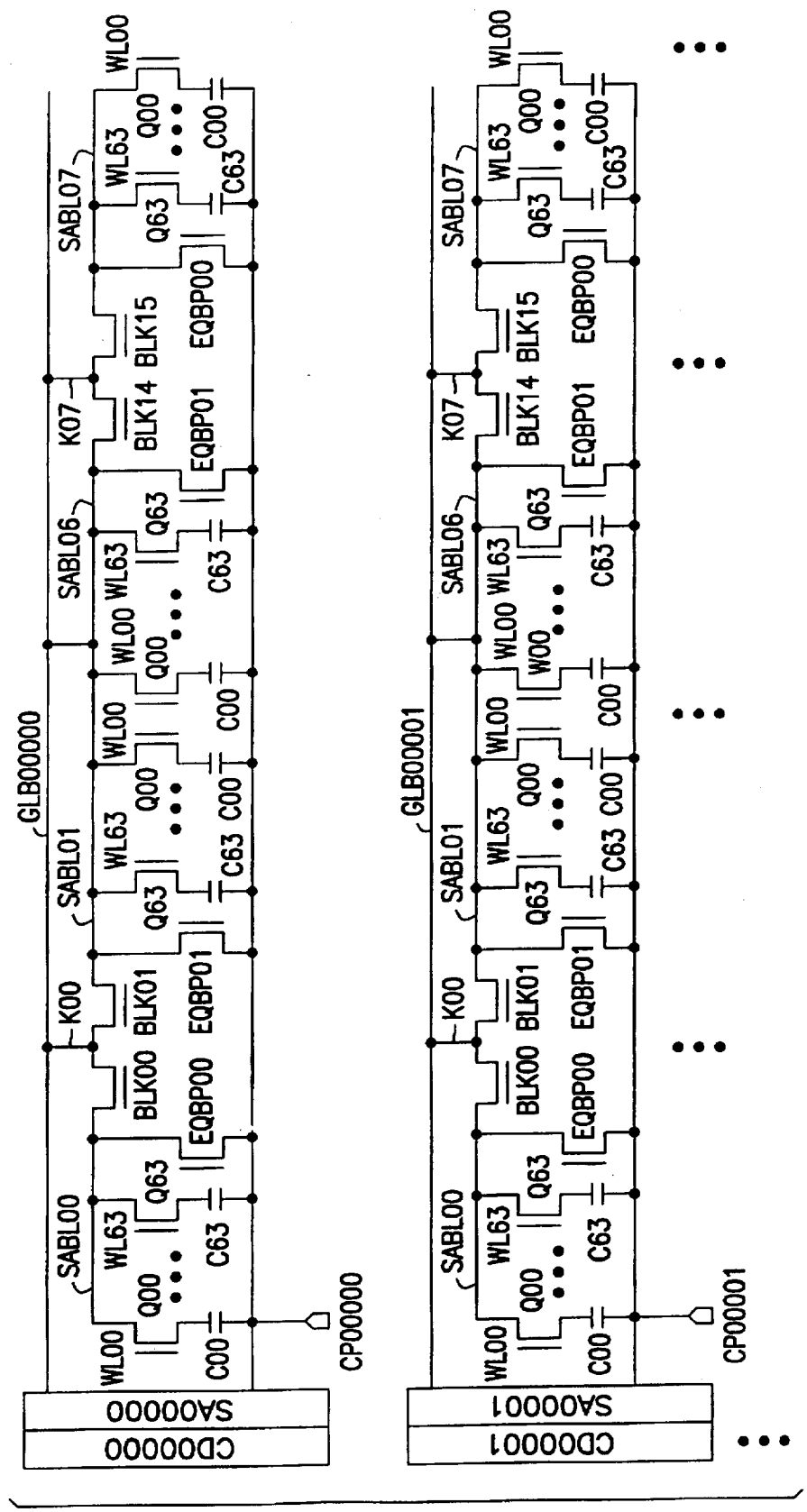
FIG. 2 is an enlarged partial schematic diagram of the inventive memory structure seen in FIG. 1 taken along the 1—1 section line, and particularly shows schematic details of the devices for the connection of two global bit lines, each global bit line being associated by eight contacts with 16 subarray bit lines, and each subarray bit line being associated with 64 word lines.

FIG. 2 is an enlarged view of the upper quadrant of the primary side of FIG. 1 shown from the 2—2 section line seen on the schematic diagram of FIG. 1. FIG. 2 shows global bit line GBL00000 connecting to contacts K00 through K07. Global bit line GBL00000 is stacked over subarray bit line SABL00 through SABL07. By way of example of the subarray structure, subarray bit line SABL00 is connected to global bit line GBL00000 through contact K00. Contact K00 connects to subarray bit line SABL00 through FET controller BLK00. Subarray bit line SABL00 has an equilibrate controller FET shown as EQBP00. The equilibration devices, seen in FIGS. 1 and 2 have EQBP00, EQBP01, etc. are shown as FETs. However, such an equilibration device can be substituted for circuitry in the sensamp devices.

Through a first electrode of a subarray FETs, subarray bit line SABL00 connects to word lines WL00 through WL63 which are connected, respectively, to the gates of the subarray FETs. Word lines WL00–WL63 are respectively connected through the gate of subarray FETs Q00 through 63 to a first electrode of FETs Q00 through Q63 all of which are connected to subarray bit line SABL00. Each word line WL00 through WL63 is associated, respectively, to capacitors C00 through C63, via the gate of subarray FETs Q00 through Q63. Each capacitor C00 through C63 serves as an example and illustration of a means for storing and communicating a storage signal. The capacitor opposite the subarray bit line SABL00 shows connection to a cell plate indicated by CP00000. The cell plate is a blanket-like structure covering most of the memory structure. Holes are positioned on the cell plate through which contact is made with $N^+$ active areas by the subarray bit lines.

The cell plate and each global bit line are connected to a separate sensamp device. As shown in FIG. 2, global bit lines GBL00000 and GBL00001 are connected, respectively, to sensamp devices SA00000 and SA00001. Column decode devices CD0000 and CD00001 are associated, respectively, with global bit lines GBL00000 and GBL00001. Each column decode device interfaces with dual sensamp devices. Thus, an efficient use of the global bit lines exists through sharing of sensamp and column decode circuitry to interface with the word lines of multiple subarray bit lines.

Each word line is in electrical communication with a corresponding word line in each of the 2,048 columns seen in FIG. 1. Thus, there are 2,047 other word lines in electrical communication with each word line. The electrical communication between word lines, while not seen in FIG. 1 and 2, is accomplished by interconnections between each gate of each subarray FET associated with the corresponding word lines. As seen in FIG. 2, the subarray FETs associated with the word lines are Q00 through Q63 for each subarray bit line. By way of illustration of such correspondence of word line interconnection, each gate of each subarray FET Q00 of each subarray bit line SABL00 of global bit lines GBL00000 through GBL02047 are electrical connected together. Similar interconnection conventions apply for the gates of subarray FETs Q01 through Q63 in each of the 2,048 columns seen in FIG. 1.

While FIGS. 1 and 2 depict a shared column decode device between sensamp devices, it is also contemplated that the column decode device need not be shared by sensamp devices. It is contemplated within the scope of the present invention that a column decode device can be separated from both the sensamp devices and global bit lines.

Figure 3:
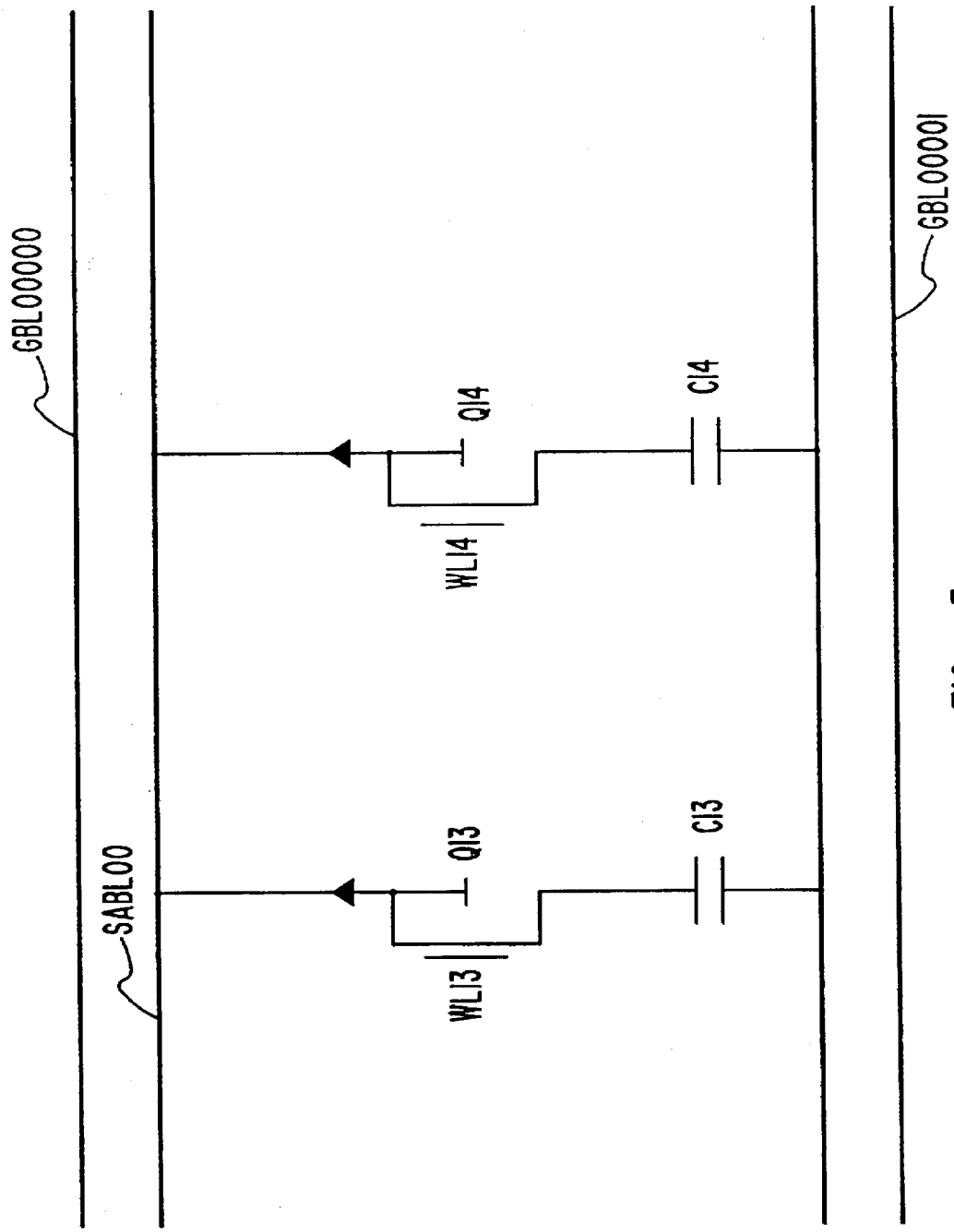
FIG. 3 shows an enlarged partial schematic diagram of the memory structure seen in FIG. 2 taken along the 3—3 section line, and particularly shows the area of the memory structure having two word lines and their associated subarray bit lines.

FIG. 3 is an enlarged sectional view of the schematic diagram in FIG. 2 shown along the 3—3 section line of FIG. 2. In FIG. 3, word lines WL13 and WL14 are shown, respectively, by connection to the gate of subarray FETs Q13 and Q14, which are respectively associated with capacitors C13 and C14. Subarray bit line SABL00 is hierarchically above subarray FETs Q13 and Q14 through connection to a first electrode of subarray FETs Q13 and Q14. SABL00 is stacked below global bit line GBL00000. FIG. 3 schematically depicts two of the 64 word lines associated with subarray bit line SABL00.

Figure 4:
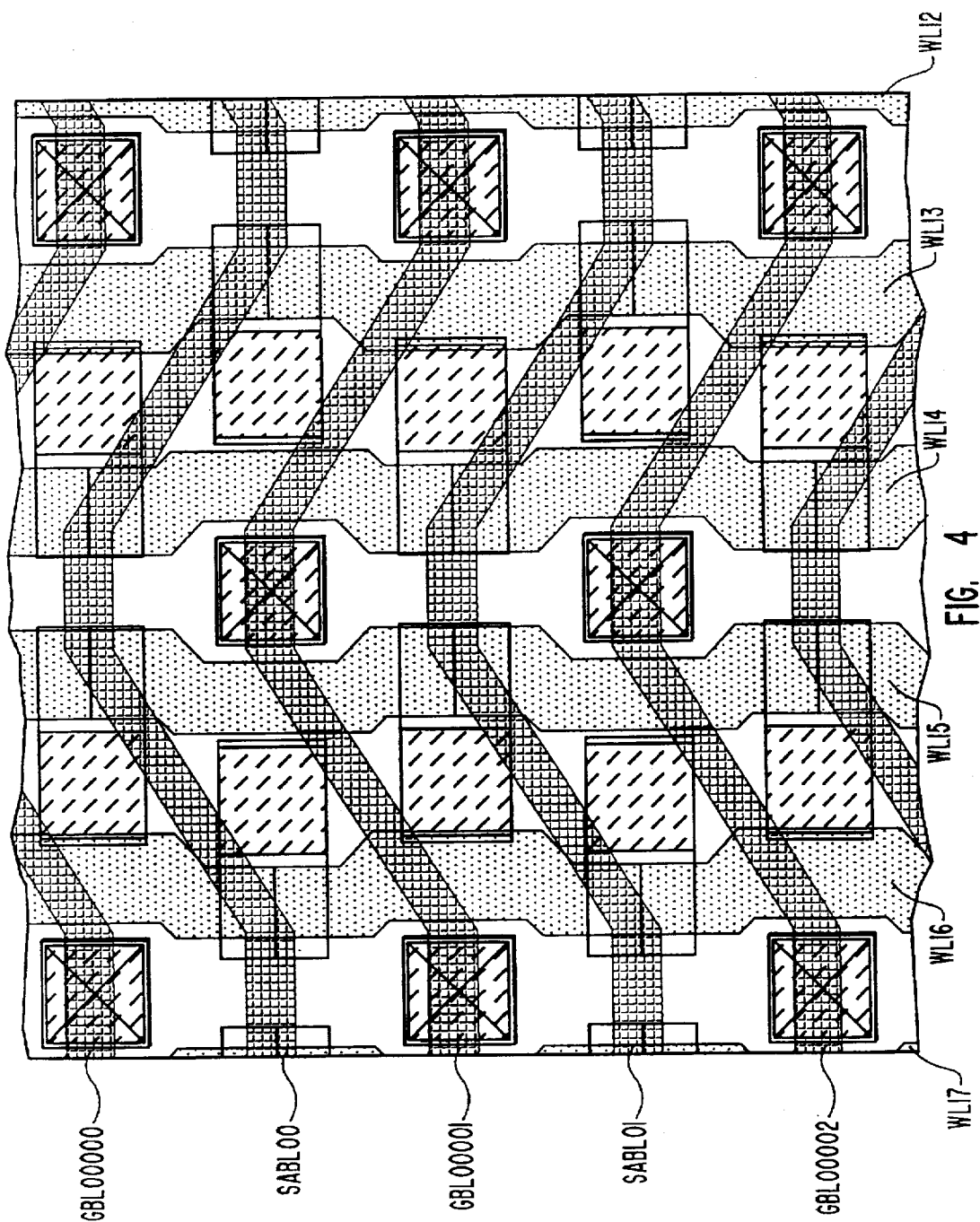
FIG. 4 is an overview of a preferred embodiment of the inventive memory structure in FIG. 2 taken during the 4—4 Section line, which is shifted from the 3—3 Section line, and shows a subarray bit line making contact with $N^+$ active regions, each of which is associated with a word line, which subarray bit line is paralleled both above and below by a global bit line.

FIG. 4 shows a partial and enlarged layout of a preferred embodiment of the inventive memory structure seen in FIG. 2 along the 4—4 section line in which there are pictured two global bit lines, one subarray bit line, and eight word lines. The global bit line and the subarray bit line are seen on a single layer of conductive material. FIG. 4 is shown with several layers removed for simplicity. Subarray bit line SABL00 is stacked in between global bit lines GBL00000 and GBL00001. Running perpendicularly to subarray bit line SABL00 are word lines WL12 through WL19. Subarray bit line SABL00 connects to an $N^+$ active area associated with a word line at each "X" seen in FIG. 4. Neither of the two global bit lines seen in FIG. 4 are connected to an $N^+$ active area. Word lines WL12 through WL19 are preferably composed of polysilicon. It is preferable that each global bit line and subarray bit line is made of a electrically conductive material, such as a metal.

Because of the staggering of the layout diagram depicted in FIG. 4, there is the appearance that only two word lines are situated in between contacts with subarray bit line SABL00. However, without the depicted staggering view seen in FIG. 4, four word lines would be seen between each contact with subarray bit line SABL00, as to be described with respect to FIG. 6 hereinafter.

In an alternative embodiment of the inventive memory structure not seen in FIG. 4, the global bit line and the subarray bit line are on separate conductive layers, such as separate metal layers, and an oxide layer separates the conductive layer of the global bit line from the conductive layer of the subarray bit line.

Figure 5:
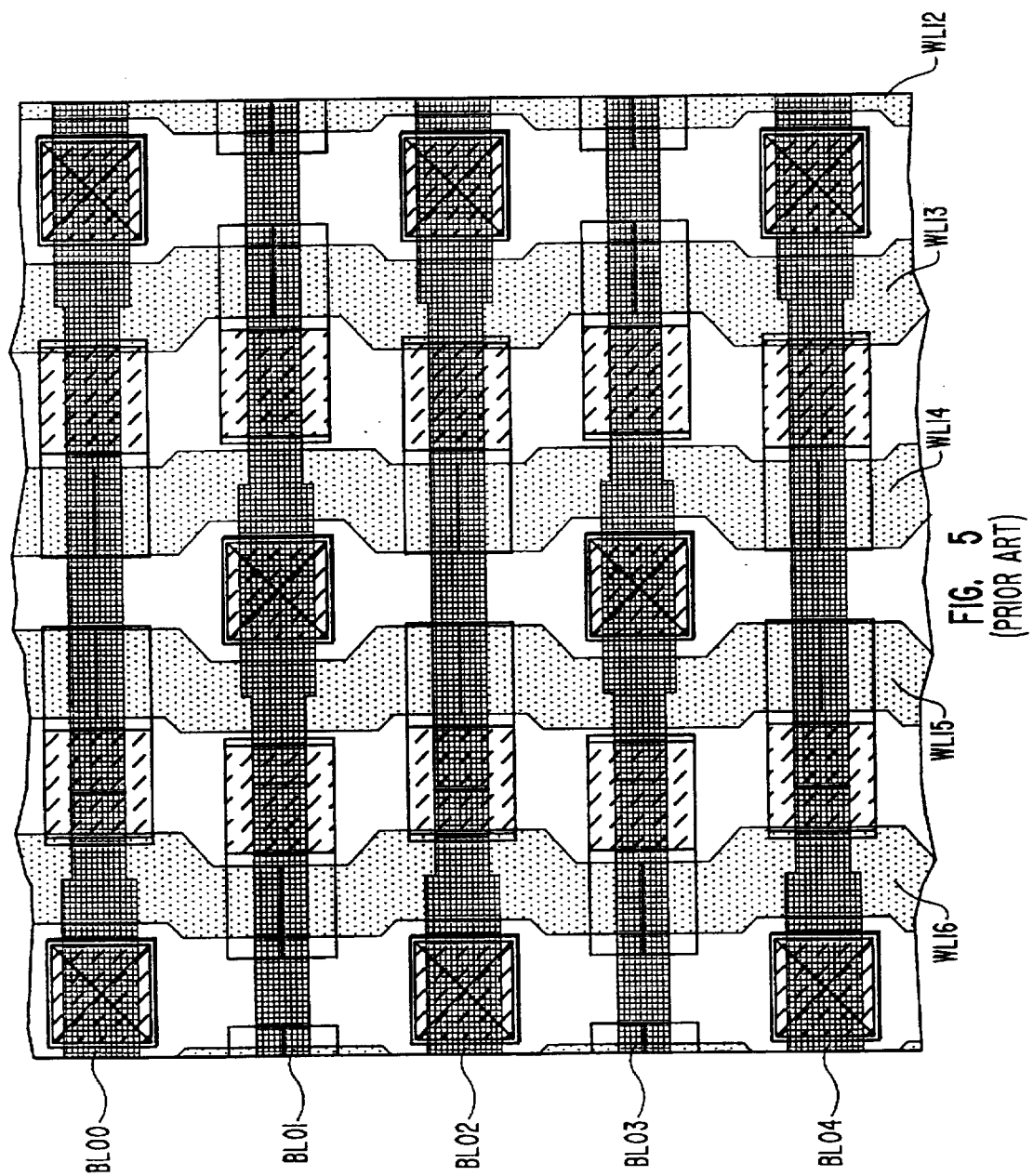
FIG. 5 shows a prior art memory structure in which 5 bit lines are in contact with five word lines.

FIG. 5 depicts a prior art memory array structure where no subarray bit lines are featured. Rather, each bit line BL00 through BL04 contacts each word line WL12 through WL16. The place of contact is seen by a "X" on FIG. 5 where each bit line BL00 through BL04 makes contact with an $N^+$ active area associated with a word line WL12 through WL16. As can be seen in FIG. 5, there are four word lines in between each point of contact with each bit line.

Figure 6:
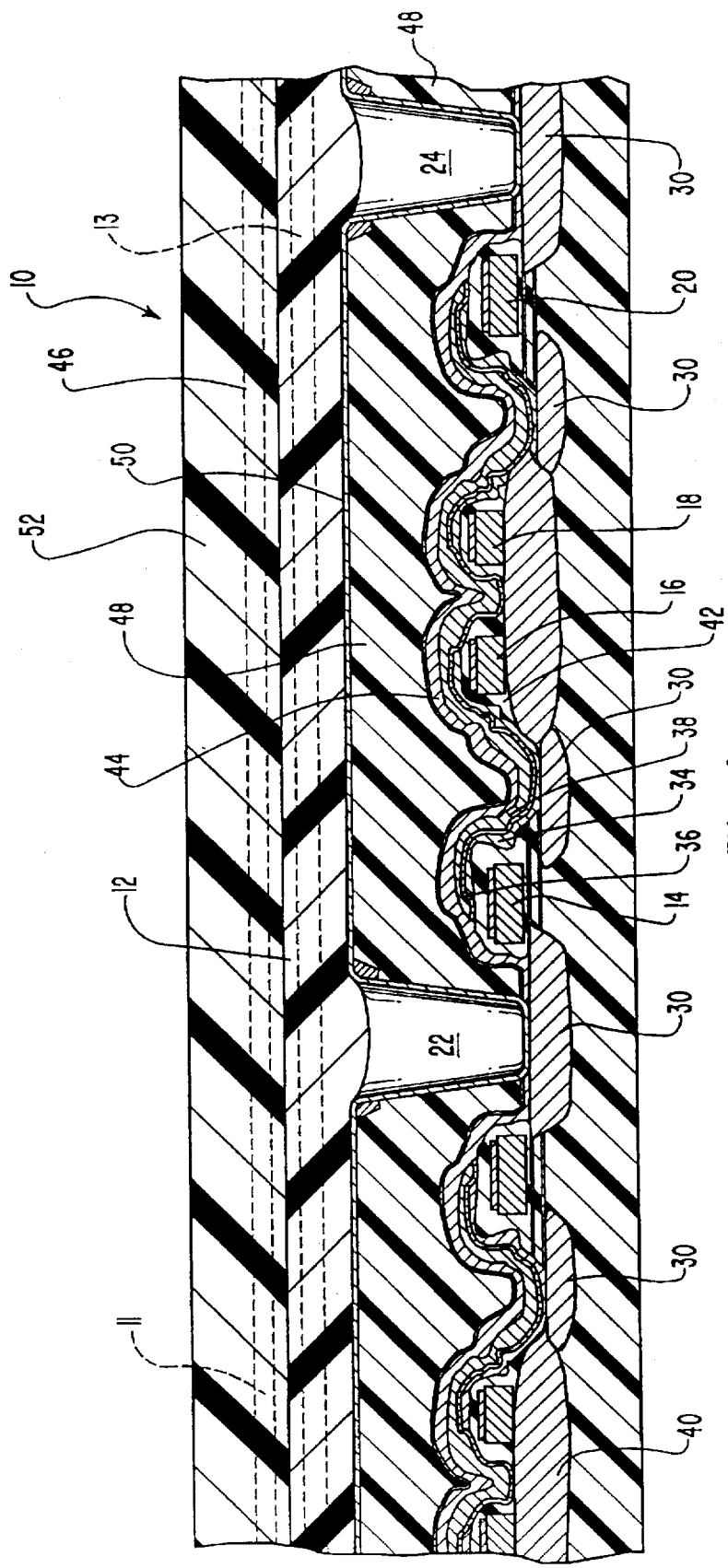
FIG. 6 is a cross-section side elevational view of a portion of a preferred embodiment of the inventive memory structure showing a subarray bit line making a vertically oriented contact with an $N^+$ active region on opposite sides of four word lines, each pair of word lines having a capacitor region therebetween, and some word lines have an $N^+$ active area on each side thereof, where those word lines and the dual $N^+$ active areas on opposite sides thereof form a transistor.

FIG. 6 shows a cross-sectional side elevational view of a preferred embodiment of the inventive memory structure, where four word lines are situated between two contacts with a subarray bit line, which contacts are also electrically connected to an $N^+$ active area. While FIG. 6 shows only a portion of a preferred embodiment of the inventive memory structure, the layered nature of the structure is that metallic bit lines are disposed over a layer of BPSG. The layer of BPSG is disposed over a polysilicon layer of top cell plate which covers over a layer of cell dielectric. Under the layer of cell dielectric is a series of polysilicon storage nodes. Each storage node connects with a buried contact which connect to an $N^+$ active area forming a fragmented bottom layer of the memory structure. Polysilicon word lines are positioned in between the buried contacts and the $N^+$ active areas. Contact fill segments extend through the layer of BPSG, the layer of top cell plate, the cell dielectric layer, around the storage nodes, around the buried contacts, and around the word lines so as to form a contacts from the bit lines to the $N^+$ active areas.

A portion of the inventive memory array structure is generally shown at 10 in FIG. 6. A subarray bit line 12 is seen as being situated on the same conductive layer with a global bit line 11 shown in phantom. In an alternative embodiment not shown, a global bit line 13 can be stacked above subarray bit line 12 on a separate conductive layer. Word lines 14, 16, 18, 20 are seen positioned between a pair of contact fills 22 and 24.

N+ active regions are shown at reference numeral 30. A capacitor is illustrated as a cell dielectric 36 surrounded by a top cell plate 36 and storage node 34. A field oxide is seen at 40, and oxides are seen at 42, 44, and 46. A layer of BPSG 48 is situated between contact fills 22, 24. A barrier 50 is immediately below subarray bit line 12. A layer of nitride passivation 52 is situated above oxide layer 46.

A transistor is made up by two N+ active areas on either side of word lines 14, 16, 18 and 20 which are preferably polysilicon word lines. A capacitor, composed of storage node 34 having cell dielectric 36 that is covered over by top cell plate 38, is seen on the right side of each word line and immediately above each N+ active area.

Figure 7:
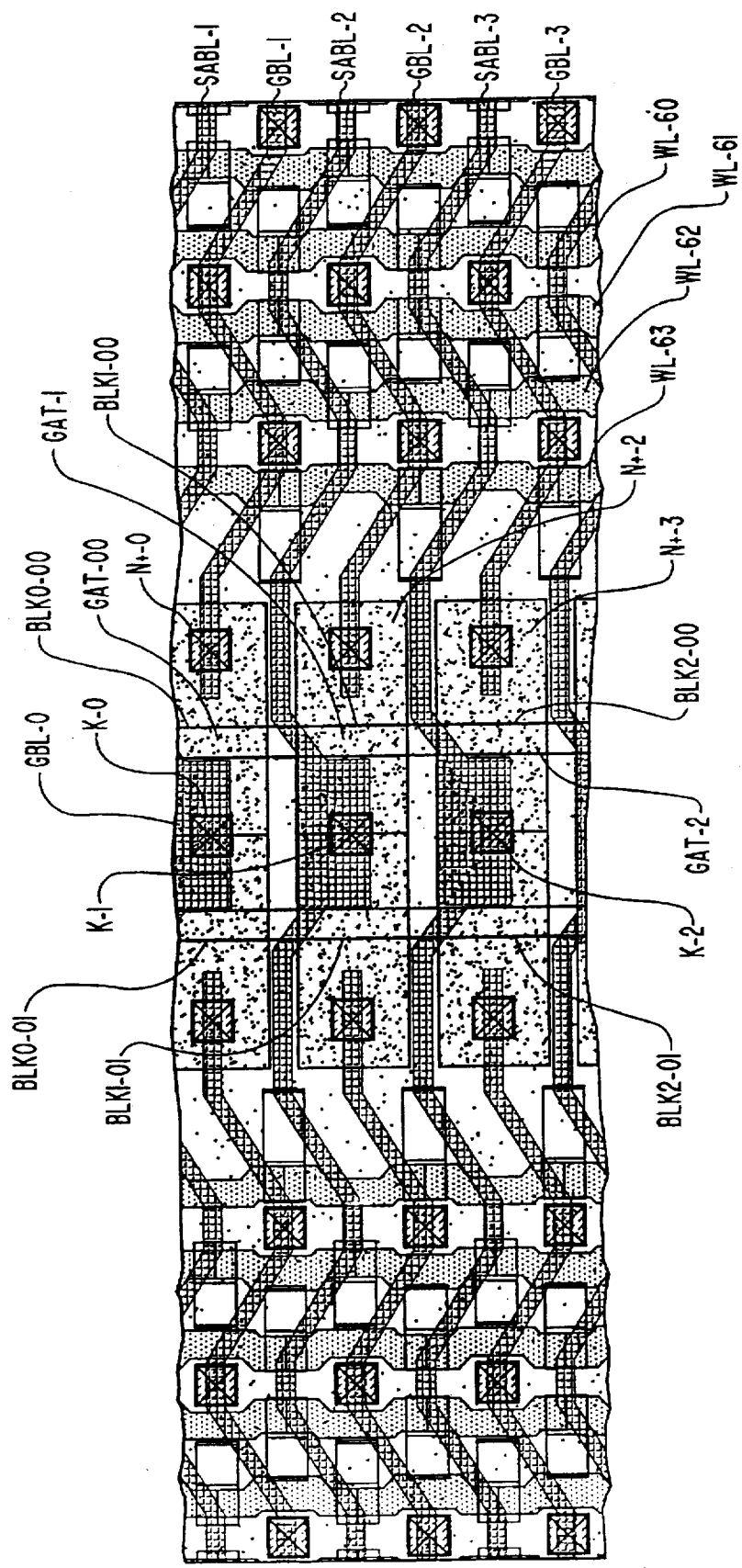
FIG. 7 is an overview of a preferred embodiment of the inventive memory structure showing subarray bit lines, and also showing global bit lines each of which makes contact with two $N^+$ active areas in between the start of one subarray bit line and the end of another subarray bit line.

FIG. 7 is a depiction of the areas of contact between a global bit line and its corresponding subarray bit lines. Contact areas K-0, K-1, and K-2 are contacts, respectively, from global bit lines GBL-0, GBL-1 and GBL-2 to N+ active areas associated with subarray bit lines that correspond, respectively to FETs BLK0-01, BLK0-00, BLK1-01, BLK1-00, BLK2-01, and BLK2-00. Each contact K-0, K-1, and K-2 has two corresponding FETs. Global bit line GBL-0 has corresponding FETs BLK0-01 and BLK0-00. Contact K-1 associated with global bit line GBL-1 has corresponding FETs BLK1-01 and BLK1-00. Contact K-2 associated with global bit line GBL-2 has corresponding FETs BLK2-01 and BLK2-00.

A gate is depicted for each of the six FETs BLK0-00, BLK0-01, BLK1-00, BLK1-01, BLK-2-01, and BLK-2-00. By Way of example, FET BLK0-00 has gate GAT-0 associated therewith. FET-BLK1-00 has gate GAT-1 associated therewith, and FET BLK2-00 has gate GAT-2 associated therewith. The contacts K-0, K-1, and K-2 with their corresponding FETs establish connection between global bit lines and the subarray bit lines hierarchically thereunder. In FIG. 7, both the subarray bit lines and the global bit lines are on the same conductive layer. In other preferred embodiments of the inventive memory array structure, the subarray bit lines and the global bit lines can be on different conductive layers.

An advantage gained by the invention, which advantage can be understood by the example of the circuitry depicted in FIGS. 4 and 7, is that subarray bit lines are electrically isolated at a constant voltage while the global bit line therebetween is operational. In so doing, the voltage of the global bit line is not effected by with the two subarray bit lines that are adjacent to the global bit line, and the bit line coupling component between adjacent bit lines is not hindered. By holding subarray bit line voltage constant, the effect of bit line coupling capacitance is reduced, as compared to conventional bit line structures where voltage is not held constant on adjacent bit lines. Thus, the electrical isolation of subarray bit lines that are adjacent to a global bit line prevents interference with the voltage on the global bit line.

The inventive memory structure electrically isolates subarrays from causing a moving effect upon the voltage of a corresponding global bit line. This electrical isolation is effected by connecting only a selected subarray bit line, and its associated memory cells, to a global bit line at a time. Unlike conventional memory structures which connects all memory cells to the bit lines simultaneously, the inventive memory array structure permits that only some of the memory cells are connected to a global bit line through access devices associated with a select subarray bit line at a time.

Electrical isolation of the subarray bit lines adjacent to a global bit line acts to block capacitance interference with the global bit line and reduces the noise effect of bit line coupling components known to conventional memory structures lacking such adjacent bit line isolation. As can be seen in FIGS. 4 and 7, the interleaving of electrically isolated subarray bit lines with global bit lines, where the global bit lines does not contact the N+ active area except at periodic points of contacts, enables an electrical blocking effect due to the electrical isolation of the subarray bit line adjacent to a global bit line.

The bit line coupling component is 15% of the overall bit line capacitance between adjacent bit lines, or a total of 30% of the capacitance for a bit line having two adjacent bit lines. The inventive memory array structure, by electrically isolating subarray bit lines, effectively reduces the bit line capacitance by about 70%. The absence of an electrical barrier for adjacent bit lines in conventional memory structures is detrimental, in that conventional memory structures connect all memory cells to the bit lines simultaneously, which causes about a 70% higher bit line coupling component. By reducing the bit line coupling component by about 70% through electrical isolation of adjacent subarray bit lines in the inventive memory array structure; there is a marked improvement in the global bit line signal strength. As seen in FIGS. 4 and 7, the patterning of the memory structure combined with the electrical isolation of subarray bit lines adjacent to a global bit line, furthers the objective of a higher signal to noise ratio.

The isolation of subarray bit lines from global bit lines is an important factor in reducing capacitance of the memory structure because on each cycle of read or write operations these capacitors must be charged and discharged. By reducing the global bit line capacitance, there is a concomitant reduction in the power consumption. While a conventional memory structure connects all capacitors therein simultaneously, only selected capacitors are connected within the inventive memory structure. The capacitance coupling component between bit lines is much smaller due to the smaller segmenting of the connections therebetween. For each small segment of word lines activating FETs to connect selected memory cells to their corresponding global bit lines that are hierarchically connected thereover, the overall capacitance is less than conventional bit lines having all of its memory cells connected thereto simultaneously. The global bit line, once connected to a selected subarray bit line, only senses the capacitance between the immediately adjacent two subarray bit lines. Due to this isolation of subarray bit lines, the global bit line does not sense the isolated and unconnected subarray bit lines so that the overall capacitance of the global bit line is reduced.

For a given bit line capacitance, the die size of the memory structure is smaller than conventional memory structures because in the inventive structure sensamp and column decode devices are shared by or among more memory cells, thus using less overhead circuitry.

Another preferred embodiment of the invention is shown in FIG. 8 where, by way of example, a superglobal bit line SGBL00000 is hierarchically above four global bit lines GBL0, GBL1, GBL2, GBL3 through four FETs SBLK00, SBLK01, SBLK02, SBLK03. Each global bit line can be electrically isolated from its corresponding superglobal bit line similar to the electrical isolation of subarray bit lines from adjacent global bit lines as is described herein with respect to FIGS. 1-4, 6 and 7. One global bit line is interfaced through a FET associated between the unisolated global bit line and its corresponding superglobal bit line.

In FIG. 8, there are 2,048 columns, each column having two superglobal bit lines connecting to dual sensamp devices which in turn share a column decode device. Each of the two superglobal bit lines have four contacts to four global bit lines, which contacts are similar to those described herein with respect to FIG. 4. As in FIGS. 1 and 2 and text herein associated therewith, each global line in the alternative preferred embodiment has 8 contacts to 16 subarray bit lines. Correspondingly, each subarray bit line has contacts to 64 word lines through a first electrode of each of 64 subarray FETs. Additionally, each word line actives through a subarray FET gate to connect a second electrode of the 64 subarray FETs to a means for storing a one bit charge, such as a capacitor. In such an embodiment of the invention, a 16 megabit memory array is accomplished.

While superglobal bit lines and global bit lines are intended to be connected through FET devices, the number of global bit lines to be connected through FETs to a superglobal bit line is contemplated to vary within the scope of the invention. Additionally, the superglobal bit line is contemplated to be on a different conductive layer than the global lines associated therewith, where the subarray bit lines and the global bit lines can be on the same or on different conductive layers. Thus, embodiments of the inventive memory array structure incorporating superglobal bit lines can have two or three conductive layers for the superglobal bit lines, the global bit lines, and the subarray bit lines.

With respect to FIG. 8, for both the primary and the secondary sides, each sensamp device has the ability to store the signal of the superglobal bit line when electrically isolated from the corresponding superglobal bit line. Similarly, each superglobal bit line has a capacitance to store the superglobal bit line signal when electrically isolated from the corresponding sensamp device, and from its corresponding global bit lines. Similarly, each global bit line has the having a capacitance to Store a global bit line signal when electrically isolated from the superglobal bit line, and from its corresponding plurality of subarray bit lines. Like the electrical isolation of each global bit line, each subarray bit line has a capacitance to store a subarray bit line signal when electrically isolated from its corresponding global bit line, and from the corresponding plurality of memory cells or capacitors associated therewith. Lastly, each memory cell or capacitor has a capacitance to store a storage signal when electrically isolated from its corresponding subarray bit line.

In order to effect the forgoing electrical isolation scheme, the inventive integrated memory array circuit in FIG. 8 isolates the sensamp device by incorporating therein a means for electrical switching, which is represented and illustrated by the sensamp devices seen in FIG. 8. The superglobal bit line is electrically isolated by the electrical switching means of the corresponding sensamp device, and by the global access devices or the global FETs. Similarly, each global bit line is electrically isolated by a corresponding one of the global access devices or FETs, and by the access devices corresponding thereto. Each subarray bit line is electrically isolated by a corresponding one of the access devices heirarchically thereover, and by its corresponding subarray access devices heirarchically thereunder. Finally, each memory cell or capacitor is electrically isolated by a corresponding subarray access device or FET. When the foregoing memory array structure components of FIG. 8 have been electrically isolated, the data temporarily stored therein can be readily and rapidly accessed.

The inventive memory array structure is contemplated to be used in a variety of memory types, each of which incorporates a plurality of access devices into the memory array structure of the memory type. The access devices are FETs in a DRAM embodiment, an example of which is a subarray FET that is activated by a word line signal from a word line to connect a capacitor to a subarray bit line through the subarray FET, and where other FETs selectively isolate or connect the subarray bit lines to global bit lines. In the case of SRAM, the access devices may be two FETs. In the case of flash memory, each access device may have a transistor with a floating gate while the memory cell forms a part of the access device itself.

For each memory type, the function of the access device is to serve as an electrical switch. As an electrical switch, each access device is capable of electrically isolating lines or devices that are connected to the access device. Alternatively, the access device is capable of electrically communicating a signal between lines or devices that are connected to the access device. Thus, access devices are capable of electrically isolating subarray bit lines from a corresponding global bit line, and electrically isolating both word lines and corresponding storing and communicating means.

In summary, for a fixed bit line capacitance the inventive memory structure is smaller in die size than convention memory structure die sizes by the provision of the inventive subarray bit lines structure with shared column decode devices between dual sensamps. Alternatively, by providing a plurality of word lines for each subarray bit line, and electrically isolatable subarray bit lines for each global bit line via access devices, a reduced effect on bit line capacitance is realized became the bit line capacitance component is reduced by connecting only selected memory cells at any one time. As the bit line capacitance component is reduced, there will also be a reduced power consumption for the memory structure because less power is needed to charge the unisolated parts of the memory array structure.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of storing data in a memory having a global bit line connected to a plurality of subarray bit lines, each one of the plurality of subarray bit lines connected to a plurality of memory storage capacitors, the method comprising the steps of:

providing a charge on one of the plurality of subarray bit lines; and electrically isolating the one of the plurality of subarray bit lines from the global bit line and from the plurality of memory storage capacitors to temporarily store the charge on one of the plurality of subarray bit lines.

2. The method of claim 1 wherein the method further comprises the step of:

equilibrating the plurality of subarray bit lines to a predetermined voltage;

electrically isolating the global bit line from the plurality of subarray bit lines;

electrically isolating the plurality of subarray bit lines from the plurality of memory storage capacitors;

amplifying data provided on the global bit line;

selectively coupling the global bit line to the one of the plurality of subarray bit lines and charge sharing the amplified data between the global bit line and the one of the plurality of subarray bit lines; and electrically isolating the global bit line from the one of the plurality of subarray bit lines to temporarily store the charge shared data.

3. The method of claim 2 wherein the method further comprises the step of:

selectively coupling the one of the plurality of subarray bit lines with one of the plurality of memory storage capacitors to store the data in the one of the plurality of memory storage capacitors.

4. A method of reading data from a memory having a global bit line connected to a plurality of subarray bit lines, each one of the plurality of subarray bit lines connected to a plurality of memory storage capacitors, the method comprising the steps of:

electrically isolating one of the plurality of subarray bit lines from the global bit line;

selectively coupling the one of the plurality of subarray bit lines with one of the plurality of memory storage capacitors;

producing a resultant subarray bit line charge by charge sharing a memory capacitor charge with an initial subarray bit line charge; and electrically isolating the one of the plurality of subarray bit lines from the one of the plurality of memory storage capacitors to temporarily store the resultant subarray bit line charge on the one of the plurality of subarray bit lines.

5. The method of claim 4 further comprising the steps of:

electrically coupling the one of the plurality of subarray bit lines with the global bit line;

producing a resultant global bit line charge by charge sharing the resultant subarray bit line charge with an initial global bit line charge; and amplifying the resultant global bit line charge.

6. A method of reading data from a memory having a global bit line connected to a plurality of subarray bit lines, each one of the plurality of subarray bit lines connected to a plurality of memory storage capacitors, the method comprising the steps of:

electrically isolating a first and a second one of the plurality of subarray bit lines from the global bit line;

selectively coupling the first one of the plurality of subarray bit lines with a first one of the plurality of memory storage capacitors;

providing a first resultant subarray bit line charge by charge sharing a first memory capacitor charge with a first initial subarray bit line charge;

electrically isolating the first one of the plurality of subarray bit lines from the first one of the plurality of memory storage capacitors to temporarily store the first resultant subarray bit line charge on the first one of the plurality of subarray bit lines;

selectively coupling the second one of the plurality of subarray bit lines with a second one of the plurality of memory storage capacitors;

providing a second resultant subarray bit line charge by charge sharing a second memory capacitor charge with a second initial subarray bit line charge; and electrically isolating the second one of the plurality of subarray bit lines from the second one of the plurality of memory storage capacitors to temporarily store the second resultant subarray bit line charge on the second one of the plurality of subarray bit lines.

7. The method of claim 6 wherein the step of providing the first resultant subarray bit line charge and the step of providing the second resultant subarray bit line charge are performed simultaneously.

8. The method of claim 6 further comprising the steps of:

electrically coupling the first one of the plurality of subarray bit lines with the global bit line;

producing a resultant global bit line charge by charge sharing the first resultant subarray bit line charge with an initial global bit line charge; and amplifying the resultant global bit line charge.

9. The method of claim 6 further comprising the steps of:

electrically coupling the second one of the plurality of subarray bit lines with the global bit line;

producing a resultant global bit line charge by charge sharing the second resultant subarray bit line charge with an initial global bit line charge; and amplifying the resultant global bit line charge.

10. A method of writing data from a memory having a global bit line connected to a plurality of subarray bit lines, each one of the plurality of subarray bit lines connected to a plurality of memory storage capacitors, the method comprising the steps of:

electrically isolating the plurality of subarray bit lines from the global bit line and the plurality of memory storage capacitors;

providing a charge on the global bit line;

selectively coupling one of the plurality of subarray bit lines with the global bit line;

producing a resultant subarray bit line charge by charge sharing the global bit line charge with an initial subarray bit line charge; and electrically isolating the one of the plurality of subarray bit lines from the global bit line to temporarily store the resultant subarray bit line charge on the one of the plurality of subarray bit lines.

11. The method of claim 10 further comprising the step of:

coupling the one of the plurality of subarray bit lines with one of the plurality of memory storage capacitors.

12. A method of writing data from a memory having a global bit line connected to a plurality of subarray bit lines, each one of the plurality of subarray bit lines connected to a plurality of memory storage capacitors, the method comprising the steps of:

electrically isolating the plurality of subarray bit lines from the global bit line and the plurality of memory storage capacitors;

providing a first charge on the global bit line;

selectively coupling a first one of the plurality of subarray bit lines with the global bit line;

producing a first resultant subarray bit line charge by charge sharing the first global bit line charge with a first initial subarray bit line charge;

electrically isolating the first one of the plurality of subarray bit lines from the global bit line to temporarily store the first resultant subarray bit line charge on the first one of the plurality of subarray bit lines;

providing a first charge on the global bit line;

selectively coupling a second one of the plurality of subarray bit lines with the global bit line;

producing a second resultant subarray bit line charge by charge sharing the second global bit line charge with a second initial subarray bit line charge; and electrically isolating the second one of the plurality of subarray bit lines from the global bit line to temporarily store the first resultant subarray bit line charge on the second one of the plurality of subarray bit lines.

13. The method of claim 12 further comprising the step of:

coupling the first one of the plurality of subarray bit lines with one of the plurality of memory storage capacitors.

14. The method of claim 12 further comprising the step of:

coupling the second one of the plurality of subarray bit lines with one of the plurality of memory storage capacitors.

* * * * *

UNITED STATES PATENT AND TRADEMARK OFFICE
CERTIFICATE OF CORRECTION

PATENT NO.   : 5,724,301  
DATED        : March 3, 1998  
INVENTOR(S)  : Seyyedy Page 1 of 1

It is certified that error appears in the above-identified patent and that said Letters Patent is hereby corrected as shown below:

<u>Column 1,</u>
Line 8, before "BACKGROUND OF THE INVENTION" insert -- GOVERNMENT RIGHTS
This invention was made with United States Government support under contract No. MDA972-94-C-0006 awarded by the Advanced Research Projects Agency (ARPA). The United States Government has certain rights in this invention. --.

Signed and Sealed this

Twenty-fifth Day of September, 2001

*Attest:*

*Nicholas P. Godici*

*Attesting Officer*

NICHOLAS P. GODICI
*Acting Director of the United States Patent and Trademark Office*